(12) United States Patent
Chen et al.

(10) Patent No.: US 8,215,797 B2
(45) Date of Patent: Jul. 10, 2012

(54) INPUT/OUTPUT DEVICE FOR DISPLAY APPARATUS

(75) Inventors: Chun-Yao Chen, Miaoli County (TW); Kuo-Chou Chang, Miaoli County (TW); Wei-Cheng Huang, Miaoli County (TW)

(73) Assignee: Coretronic Corporation, Chunan, Miaoli County (TW)

( * ) Notice: Subject to any disclaimer, the term of this patent is extended or adjusted under 35 U.S.C. 154(b) by 1714 days.

(21) Appl. No.: 11/513,201

(22) Filed: Aug. 31, 2006

(65) Prior Publication Data

US 2007/0058334 A1 Mar. 15, 2007

(30) Foreign Application Priority Data

Sep. 9, 2005 (TW) ................................ 94131206 A

(51) Int. Cl.
*F21V 33/00* (2006.01)
*H05K 5/00* (2006.01)

(52) U.S. Cl. .................................. 362/253; 361/679.01
(58) Field of Classification Search .................... 362/86, 362/253, 276, 311.02, 489; 361/679.01
See application file for complete search history.

(56) References Cited

U.S. PATENT DOCUMENTS

2010/0254077 A1* 10/2010 Yoshikawa ............... 361/679.01
* cited by examiner

*Primary Examiner* — David V Bruce
(74) *Attorney, Agent, or Firm* — Muncy, Geissler, Olds & Lowe, PLLC

(57) ABSTRACT

An input/output device used for connecting at least one external wire with a display apparatus, comprises a case, at least one I/O connector, a flip cover, and a lighting device. The case embedded in the case of the display apparatus has a wiring slot to provide the wire passing through the case. The I/O connectors embedded on the case are electrically connected to the display apparatus. The flip cover is pivoted on the case. The lighting device having a light source and a switch is associated with the flip cover to turn on or turn off the light source.

19 Claims, 1 Drawing Sheet

INPUT/OUTPUT DEVICE FOR DISPLAY APPARATUS

RELATED APPLICATIONS

The present application is based on, and claims priority from, Taiwan Application Serial Number 94131206, filed Sep. 9, 2005, the disclosure of which is hereby incorporated by reference herein in its entirety.

FIELD OF THE INVENTION

The present invention relates to an input/output (I/O) device, and particularly relates to an input/output device for a display apparatus.

BACKGROUND OF THE INVENTION

Because of developments in media technology, many types of peripheral equipments for display apparatuses have been conceived. Consequently, displays require more and more built-in input/output (I/O) ports either for receiving or transmitting the media signals provided by the peripheral equipments.

Generally, conventional built-in I/O ports are set on a rear case of a display. However, it is inconvenient for both connecting and disconnecting peripheral wires, especially for flat panel displays, which have little space for accommodating ports.

To resolve the problem, I/O ports have been set on lateral side of the screen. However, wires connected in this way disturb the otherwise elegant appearance of a flat panel display.

SUMMARY OF THE INVENTION

The objective of the present invention is providing an input/output device for a display apparatus with more convenience in using and without interfering with the appearance of the display apparatus.

To achieve the above-mentioned objective, an input/output device is provided for connecting at least one external wire with a display apparatus. The input/output device comprises a case and at least one I/O connector, a flip cover and a lighting device. The case is embedded in the cover case of the display apparatus. The case has at least one wiring slot penetrating at least one sidewall of the flip cover to allow the external wire to be inserted through the case. The input/output (I/O) connector is embedded in the case and electrically connected with the display apparatus.

The case is indented to define a recess in which external wires are inserted after being fed through at least one wiring slot of the case. The flip cover is a foldable cover used for covering the recess. The lighting device has a light source and a switch, wherein the switch electrically connects the display apparatus with the light source to control the light source according to whether the flip cover is open or closed. The lighting device lightens the recess to help a user either connecting or disconnecting the external wires with the I/O connector more conveniently. The wiring slots help the user to arrange the external wires inserted therethrough more regularly.

BRIEF DESCRIPTION OF THE DRAWINGS

The foregoing aspects and many of the attendant advantages of this invention are more readily appreciated as the same become better understood by reference to the following detailed description, when taken in conjunction with an accompanying drawing, wherein.

DETAILED DESCRIPTION OF THE PREFERRED EMBODIMENT

Figure 1:
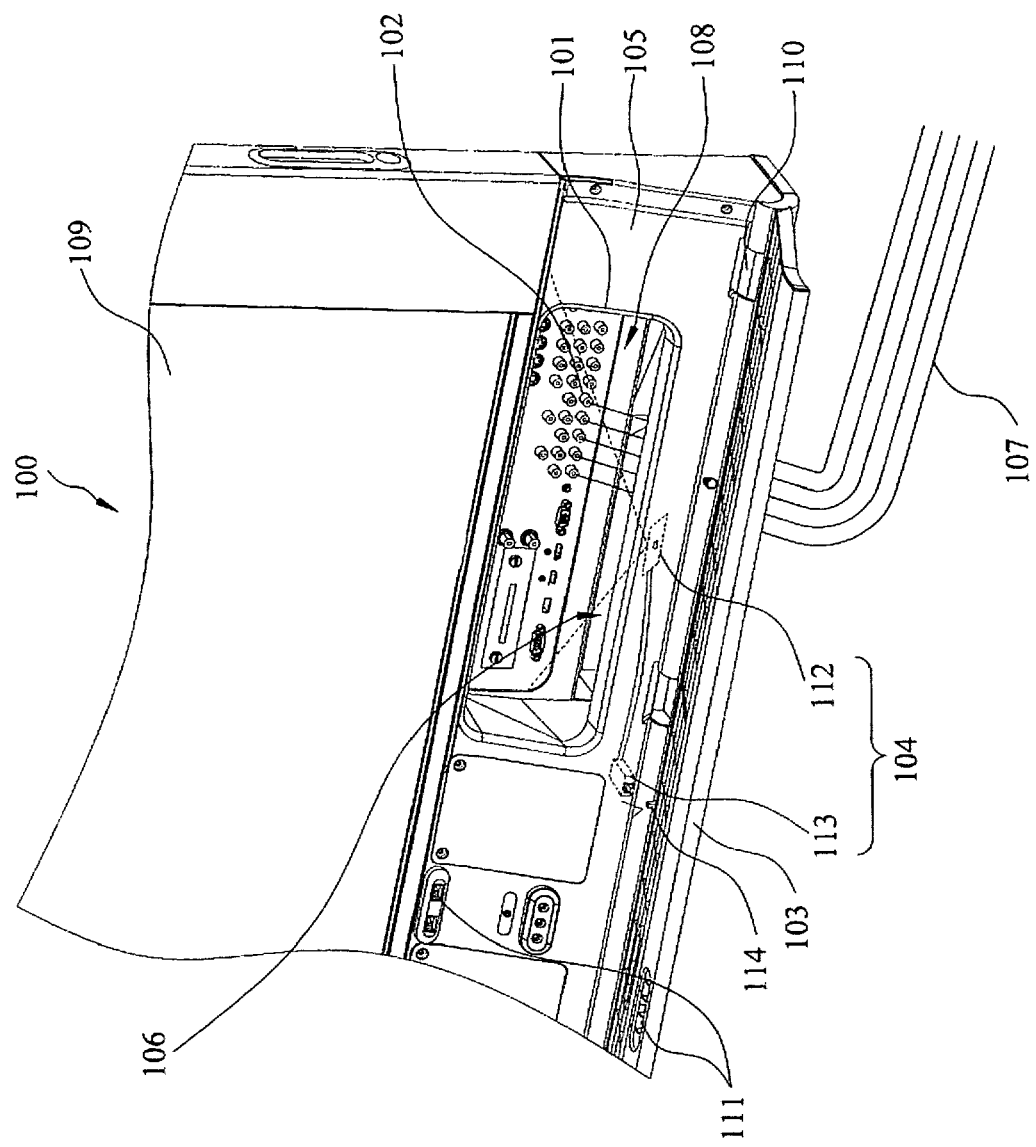
FIG. 1 illustrates a partially perspective view of an input/output device for a display apparatus in accordance with a preferred embodiment of the present invention.

Referring to FIG. 1, an input/output device for a display apparatus 100 is connected with at least one external wire 107. The input/output device comprises a case 101, at least one input/output (I/O) connector 102, a flip cover 103, and a lighting device 104.

The case 101 embedded in the cover case 105 of the display apparatus 100 has at least one wiring slot 106 penetrating the sidewalls of the cover case 105 to allow a plurality of external wires, such as wires 107, to be inserted into the case 101. In the preferred embodiment of the present invention, the case 101 and the cover case 105 are formed integrally, and the case 101 has a recess 108. A plurality of I/O connectors 102 is embedded on the sidewalls of the recess 108. The case 101 is disposed at two lateral sides of the display apparatus 100 along the screen 109 or just beneath the screen 109. In the preferred embodiment of the present invention, the case 101 is disposed beneath the screen 109 of the display apparatus 100.

The wiring slot 106 penetrating one of the sidewalls of the recess 108 allows a plurality of external wires 107 to be inserted into the recess 108 through the sidewalls of the cover case 105. In the preferred embodiment of the present invention, the wiring slot 106 is formed on the bottom sidewall of the recess 108 and penetrates through the bottom of the cover case 105. The external wires 107 are inserted into the recess 108 of the display apparatus 100 through the bottom of the cover case 105 and the wiring slot 106 and are electrically connected with the I/O connectors 102 respectively. In other embodiments of the present invention, the wiring slot 106 is formed on the rear sidewall of the recess 108 and penetrates through the rear side of the cover case 105. Then the external wires 107 are inserted into the recess 108 of the display apparatus 100 through the rear side of the cover case 105 and the wiring slot 106 and are electrically connected with the I/O connectors 102 respectively.

The I/O connectors 102 embedded on the sidewall of the recess 108 are further electrically connected to the mainframe of the display apparatus 100. In the preferred embodiment of the present invention, each I/O connectors 102 comprises an input terminal and an output terminal and is selected from a group consist of Video Graphics Array (VGA) connectors, Digital Visual Interface (DVI) connectors, Universal Serial Bus (USB) connectors, RCA connectors, Bus connectors, British Naval Connectors (BNC), S terminals or the arbitrary combination thereof.

The flip cover 103 serves as a foldable cover for closing the recess 108 to cover the I/O connectors 102 and the wiring slot 106. In the embodiment of the present invention, the flip cover 103 is pivoted on a sidewall of the case 101 by a pivot element 101 and is wedged with the case 101 by a wedging element 111 to close the recess 108. When the recess 108 is closed, the flip cover 103 covers a portion of the cover case 105. The flip cover 103 and the screen 109 of the display apparatus 100 are formed a flat surface.

The lighting device 104 has a light source 112 and a switch 113. The light source 112 set in the recess 108 is used for lightening the recess 108, wherein the light source 112 includes a tungsten lamp or a light emitting diode (LED). In the preferred embodiment of the present invention, the light source 112 is an LED set on a sidewall of the recess 108. The switch 113 electrically connects the display apparatus 100 and the light source 112, and is associated with the flip cover 103 to turn on or off the light source 112 as the flip cover 103 turns on or off. In the preferred embodiment of the present invention, the switch 113 is fixed on a sidewall of the recess 108 and is a push-type switch associated with a flange 114. When the recess 108 is closed up by the flip cover 103, the flange 114 presses the switch 113 to break the electrical connection between the display apparatus 100 and the light source 112. When the flip cover 103 is hinged open to uncover the recess 108, the switch 113 is released from the flange 114, so as to recover the electrical connection between the display apparatus 100 and the light source 112 to lighten the recess 108, thus a user either connecting or disconnecting the external wires 107 with the I/O connectors 102 is more convenient.

According to the aforementioned embodiments, the features of the present invention are utilizing the input/output device while providing light to facilitate the connecting or disconnecting external wires and I/O ports of a display apparatus. The input/output device also provides at least one wiring slot for inserting the external wires therethrough to better arrange the external wires. In addition, the flip cover covers the input/output device to improve the entire appearance of the display apparatus. Furthermore, the I/O connectors set on the sidewall adjacent to the screen of the display apparatus make the wiring operation more convenient.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. An input/output device used for connecting at least one external wire with a display apparatus, the display apparatus having a cover case, the input/output device comprising:
    a case embedded in the cover case of the display apparatus, the case having at least one wiring slot penetrating at least one sidewall of the cover case to allow the external wire to be inserted through the cover case; and
    at least one input/output (I/O) connector embedded in the case and electrically connected with the display apparatus.

2. The input/output device in accordance with claim 1, wherein the case has a recess with sidewalls surrounding, and the I/O connector is embedded in the sidewalls, and the wiring slot is formed on the bottom sidewall of the recess and penetrates through the bottom of the cover case to allow the external wire to be inserted into the recess through the bottom sidewall of the cover case and electrically connected with the I/O connector.

3. The input/output device in accordance with claim 1, wherein the display has a screen disposed thereon, and the case is disposed beneath the screen of the display apparatus.

4. The input/output device in accordance with claim 1, wherein the display has a screen disposed thereon, and the case is disposed at two lateral sides of the display apparatus along the screen.

5. The input/output device in accordance with claim 1, wherein the I/O connector comprises an input terminal and an output terminal for electrical connecting with the external wire.

6. The input/output device in accordance with claim 1, wherein the I/O connector is selected from a group consisting of Video Graphics Array (VGA) connector, Digital Visual Interface (DVI) connector, Universal Serial Bus (USB) connector, RCA connector, Bus connector, British Naval Connector (BNC), S terminal, and any arbitrary combination thereof.

7. The input/output device in accordance with claim 1, wherein the case is a portion of the cover case.

8. The input/output device in accordance with claim 1, further comprising a flip cover for serving as a foldable cover used for closing the recess to cover the I/O connector and the wiring slot.

9. The input/output device in accordance with claim 8, wherein the flip cover is pivoted on a sidewall of the case by a pivot element.

10. The input/output device in accordance with claim 8, further comprising a lighting device having a light source and a switch, the light source being set in the recess and lighting the recess, and the switch electrically connecting the display apparatus with the light source and being associated with the flip cover for turning on or off the light source.

11. An input/output device used for connecting at least one external wire with a display apparatus, the display apparatus having a cover case, the input/output device comprising:
    a case embedded in the cover case of the display apparatus;
    a flip cover, serving as a foldable cover for covering the case; and
    a lighting device having a light source and a switch, the light source being set in the recess and lighting the recess, and the switch electrically connecting the display apparatus with the light source and being associated with the flip cover for turning on or off the light source.

12. The input/output device in accordance with claim 11, wherein the case is a portion of the cover case.

13. The input/output device in accordance with claim 11, wherein the flip cover is pivoted on a sidewall of the case by a pivot element.

14. The input/output device in accordance with claim 11, wherein the display has a screen disposed thereon, and the case is disposed beneath the screen of the display apparatus.

15. The input/output device in accordance with claim 11, the display has a screen disposed thereon, and the case is disposed at two lateral sides of the display apparatus along the screen.

16. The input/output device in accordance with claim 11, wherein the flip cover comprises a flange associated with the switch for pressing the switch to turn on the light source.

17. The input/output device in accordance with claim 11, wherein the light source is selected from a group consisting of a tungsten lamp, a light emitting diode (LED), and any arbitrary combination thereof.

18. The input/output device in accordance with claim 11, wherein the case has at least one wiring slot penetrating the sidewall of the cover case to allow the external wires to be inserted therethrough.

19. An input/output device used for connecting at least one external wire with a display apparatus, the display apparatus having a cover case, the input/output device comprising:
    a case embedded in the cover case of the display apparatus, the case having at least one wiring slot penetrating the sidewall of the cover case to allow the external wires to be inserted therethrough;
    at least one I/O connector embedded in the case and electronically connected with the display apparatus;
    a flip cover, serving as a foldable cover for covering the case; and
    a lighting device having a light source and a switch, the light source being set in the recess and lightening the recess, and the switch electrically connecting the display apparatus with the light source and being associated with the flip cover for turning on or off the light source.

* * * * *